United States Patent [19]
Miyata et al.

[11] 3,954,584
[45] May 4, 1976

[54] PHOTOPOLYMERIZABLE VINYLURETHANE LIQUID COMPOSITION

[75] Inventors: Nobuyoshi Miyata; Hiroyuki Nakayama, both of Hiratsuka, Japan

[73] Assignee: Kansai Paint Company, Amagasaki, Japan

[22] Filed: Feb. 24, 1975

[21] Appl. No.: 552,290

Related U.S. Application Data
[62] Division of Ser. No. 371,579, June 20, 1973, Pat. No. 3,907,865.

[52] U.S. Cl. ............................ 204/159.23; 96/35.1; 96/115 P; 204/159.22; 204/159.24; 260/77.5 AP; 260/77.5 MA; 427/53; 427/54; 428/423
[51] Int. Cl.² ........................ C08F 2/46; C08F 4/00; C07C 125/06
[58] Field of Search .................. 204/159.23, 159.24; 260/471 C, 77.5 AP, 77.5 MA

[56] References Cited
UNITED STATES PATENTS

| | | | |
|---|---|---|---|
| 3,424,730 | 1/1969 | Lee | 260/471 C |
| 3,907,865 | 9/1975 | Miyata et al. | 260/471 C |

*Primary Examiner*—Richard B. Turer
*Attorney, Agent, or Firm*—Wigman & Cohen

[57] ABSTRACT

A photopolymerizable vinylurethane monomer and a composition thereof useful for the preparation of printing plates and reliefs, the vinylurethane monomer being expressed in general by the following chemical formula:

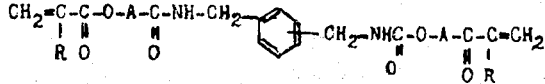

or

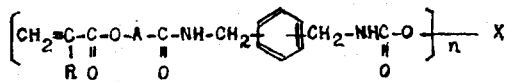

in which R represents a hydrogen atom or a methyl group, X represents an alkylene or alkane-triyl to -hexayl group or polyalkyleneoxy group having a number average molecular weight not exceeding 2000 or 3000 respectively, and n represents a corresponding number to the valency of the group X selected from 2 to 6, and A represents an alkyleneoxy group or polyalkyleneoxy group of the formula:

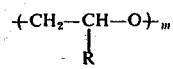

where R is a hydrogen atom or a methyl group and m is a positive integer of 1 to 11, and the composition comprising the vinylurethane monomer, ethylenically unsaturated liquid monomers and a photosensitizer.

8 Claims, No Drawings

2

PHOTOPOLYMERIZABLE VINYLURETHANE LIQUID COMPOSITION

This is a division of application Ser. No. 371,579 filed June 20, 1973, now U.S. Pat. No. 3,907,865.

THE DETAILED DESCRIPTION OF THIS INVENTION

The invention relates to photopolymerizable vinylurethane monomers and photopolymerizable compositions thereof.

Particularly this invention relates to photopolymerizable vinylurethane monomer which contains 2 to 6 ethylenically unsaturated groups connected to each other via urethane linkages and photopolymerizable compositions useful for the preparation of photosensitive printing plates and relieves comprising the vinylurethane monomer as an indispensable component.

In general the photopolymerizable vinylurethane monomer of the present invention is prepared from xylylene diisocyanate, acrylic esters or methacrylic esters having one hydroxyl group and di-, tri-, tetra-, penta- or hexa-hydric alcohols through the reaction of the isocyanate groups with the hydroxyl groups to form urethane linkages. The vinylurethane monomer of the present invention may be used by homopolymerizing or copolymerizing with one or more of ethylenically unsaturated monomers by irradiation of actinic rays with the aid of photosensitizers.

In the prior arts vinylurethane monomers having two ethylenically unsaturated groups and two or more of urethane linkages in the molecules thereof are well known. However, the known vinylurethane monomers are prepared from aromatic diisocyanate compounds having two isocyanate groups connected directly to the aromatic nuclei such as tolylene diisocyanate or 4,4'-diphenylmethane diisocyanate or aliphatic diisocyanate compounds such as hexamethylene diisocyanate as one component. Such vinylurethane monomers and compositions containing them can cure with comparatively high reaction rate by the aid of free radical catalysts and, in some instance, heat but have rather meager photo-curability. Therefore, they are insufficient for use to form printing elements of photosensitive printing plates where photo-curability is important in view of the practicality.

Fortunately the inventors of the present invention have found a fact that the vinylurethane monomers prepared from xylylene diisocyanate as an indispensable component which has two isocyanate groups attached to the benzene nucleus indirectly by way of each one methylene group can show extremely high photo-curability, and that fluid composition consisting of such vinylurethane monomers, photosensitizer and, if necessary, other ethylenically unsaturated monomers can cure to a hard mass having an adequate mechanical property enough for use as a printing plate by irradiation of actinic rays in a short time not exceeding 10 minutes and the unirradiated portion can be washed off completely with developing liquid such as water, aqueous solution of surfactants, organic solvents or mixtures thereof. Furthermore, the cured mass derived from xylylene diisocyanate does not show yellowing in course of time which is a fatal deficiency in the cases of using tolylene diisocyanate and the like, that is an indispensable superiority in the cases of ornamental relieves for display or decoration.

The photopolymerizable vinylurethane monomers of the present invention have in general the following chemical formula:

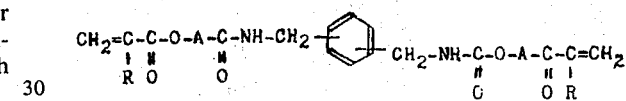

or

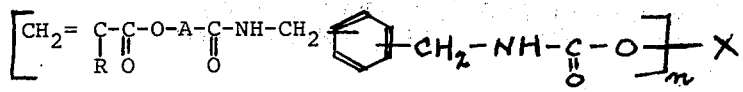

in which
R represents a hydrogen atom or a methyl group,
A represents an alkyleneoxy group or a polyalkyleneoxy group of the formula:

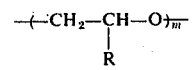

where
R is a hydrogen atom or a methyl group, and
m is a positive integer of 1 to 11,
X represents an alkylene group having carbon atoms of 2 to 6 such as

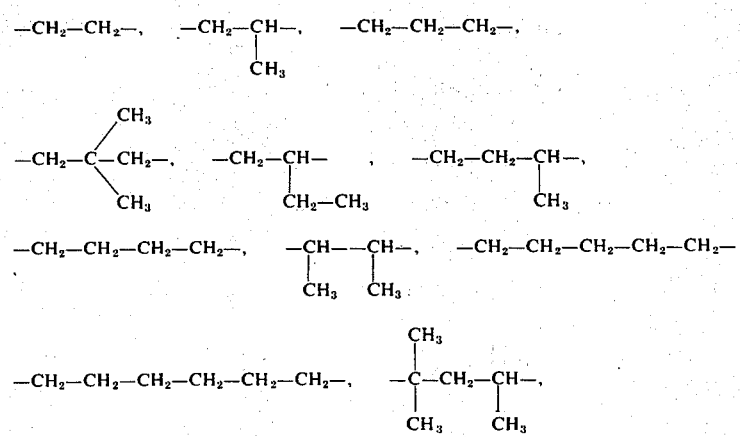

a polyalkyleneoxy group having a number average molecular weight of not exceeding 2000 and being expressed by the formula

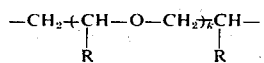

in which
R represents a hydrogen atom or a methyl group, and
k represents a positive integer of 1 to 44 when R represents a hydrogen atom or 33 when R represents a methyl group, or an alkane-tri-, -tetra-, -penta- or -hexa-yl group such as

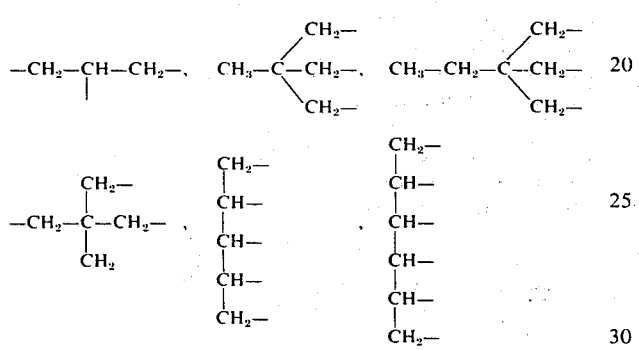

X also represents an oxygenated alkane-tri- to -hexa-yl group having a number average molecular weight of not exceeding 3000 and having a chemical formula such as

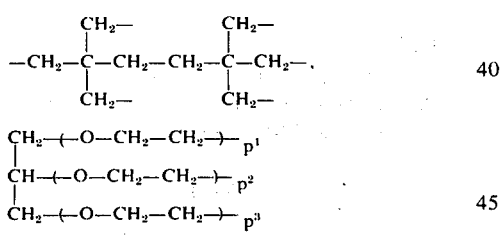

where the average number of $p^1$ to $p^3$ does not exceed 22,

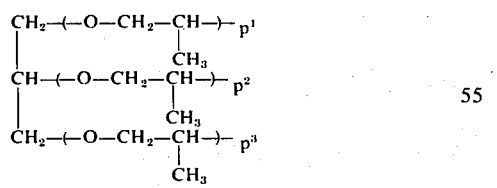

where the average number of $p^1$ to $p^3$ does not exceed 16,

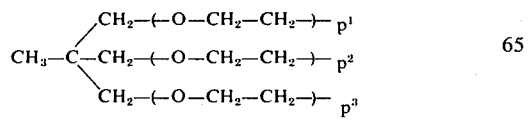

where the average number of $p^1$ to $p^3$ does not exceed 21,

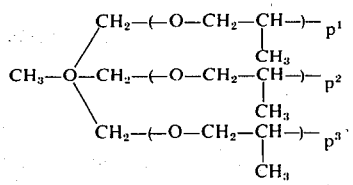

where the average number of $p^1$ to $p^3$ does not exceed 16,

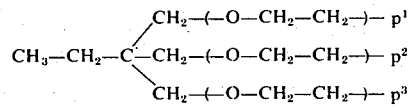

where the average number of $p^1$ to $p^3$ does not exceed 21,

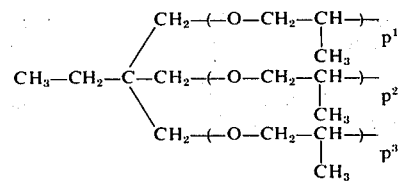

where the average number of $p^1$ to $p^3$ does not exceed 16,

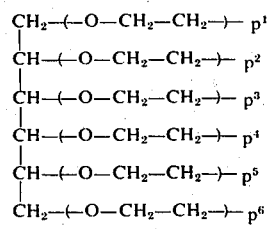

where the average number of $p^1$ to $p^6$ does not exceed 10, and

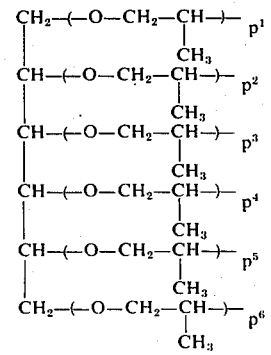

where the average number of $p^1$ to $p^6$ does not exceed 7.

The X also further represents an oxygenated alkane-tri- to -hexa-yl group having a chemical formula such that being formed by co-polyaddition of ethyleneoxy and propyleneoxy structures with an alkane-tri- to hexa-yl group such as

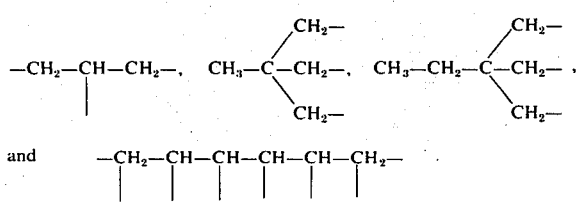

and having a number average molecular weight not exceeding about 3000.

The photopolymerizable vinylurethane monomer of the present invention are prepared at least by the reaction of xylylene diisocyanate

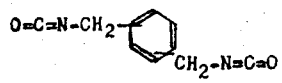

with an ethylenically unsaturated alcohol. Usually xylylene diisocyanate as a commercial product is composed of two or three isomers, namely, meta-, para- and ortho-xylylene diisocyanates. Any of them is sufficient for use in the present invention and the mixtures of them also will do.

The ethylenically unsaturated alcohol is represented by the chemical formula

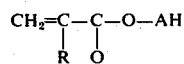

wherein
R represents a hydrogen atom or a methyl group and
A represents an alkyleneoxy group or polyalkyleneoxy group expressed by the formula

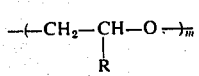

in which R is a hydrogen atom or a methyl group, and $m$ is a positive integer of 1 to 11. When an ethylenically unsaturated alcohol with $m$ exceeding 11 is used, unfavorable polymerization of the unsaturated groups is inevitable to some extent in course of the addition reaction owing to the low reactivity with isocyanate groups which requires a comparatively higher reaction temperature and longer reaction time.

Specifically, the ethylenically unsaturated alcohol is at least one member selected from a group consisting of 2-hydroxyethyl acrylate, 2-hydroxyethyl methacrylate, 2-hydroxypropyl acrylate, 2-hydroxypropyl methacrylate, polyethyleneglycol monoacrylate, polyethyleneglycol monomethacrylate, polypropyleneglycol monoacrylate and polypropyleneglycol monomethacrylate.

In the preparation of the photopolymerizable vinylurethane monomers of the present invention where a moderate increase of the molecular weight is desired, dihydric alcohol is used as the chain extender, and when the increase of the molecular weight and the increase of the degree of the unsaturation are desired at the same time, a tri-, tetra-, penta- or hexahydric alcohol is used as the chain extender and as the chain branching unit component. As to the dihydric to hexahydric alcohol which may be used, there are, for example, dihydric alcohols such as
ethylene glycol,
1,2-propanediol,
1,3-propanediol,
neopentyl glycol (2,2-dimethylpropanediol),
1,2-butanediol,
1,3-butanediol,
1,4-butanediol,
2,3-butanediol,
1,5-pentanediol,
1,6-hexanediol,
2-methylpentane-2,4-diol,
polyethylene glycols of number average molecular weight not exceeding about 2000, and
polypropylene glycols of average molecular weight not exceeding about 2000,
trihydric alcohols such as
glycerol,
trimethylol ethane (1,1,1-trishydroxymethyl ethane), and
trimethylol propane (1,1,1-trishydroxymethyl propane),
tetrahydric alcohols such as
pentaerithritol,
pentahydric alochols such as
D-arabitol,
L-arabitol,
adonitol, and
xylitol,
and hexahydric alcohols such as
dipentaerithritol
D- and L-sorbitol,
D- and L-mannitol,
D- and L-iditol,
D- and L-talitol,
dulcitol, and allitol.

In the cases where polyethylene glycol or polypropylene glycol is used, they should have a number average molecular weight not exceeding 2000, and if those having a number average molecular weight exceeding 2000 is used, the photocurable composition cannot contain the divinylurethane monomer in high enough concentration for the application because of the higher molecular weight and the linear configuration of the molecules of the divinylurethane monomers so that the photocurability of the composition becomes insufficient.

In addition to the above, there are alkyleneoxy trihydric alcohol, alkyleneoxy hexahydric alcohols and the like which are derived from the trihydric to hexahydric alcohols listed above by the addition reaction with ethylene oxide and/or propylene oxide and have a number average molecular weight of not exceeding 3000. However, those oxygenated polyols having polyethyleneoxy and/or polypropyleneoxy structure and having a number average molecular weight exceeding 3000 cannot be used in the present invention because of the high molecular weight of the vinylurethane monomers and the lower photocurability and the higher viscosity of the practical compositions containing the vinylurethane monomers.

As the typical examples of the above explained polyalkyleneoxy polyols there are compounds of the following chemical formulae:

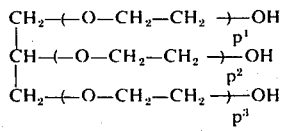

where the average number of $p^1$ to $p^3$ does not exceed 22,

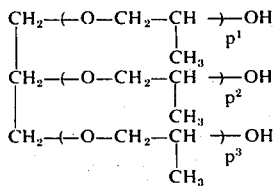

where the average number of $p^1$ to $p^3$ does not exceed 16,

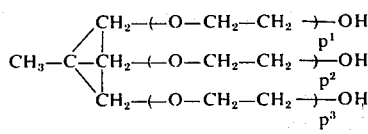

where the average number of $p^1$ to $p^3$ does not exceed 21,

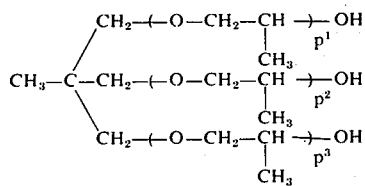

where the average number of $p^1$ to $p^3$ does not exceed 16,

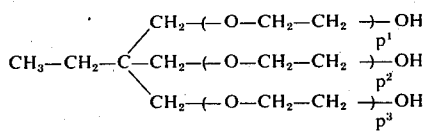

where the average number of $p^1$ to $p^3$ does not exceed 21,

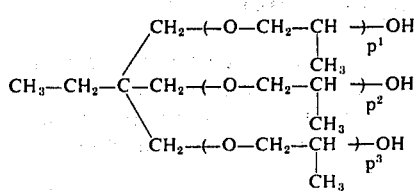

where the average number of $p^1$ to $p^3$ does not exceed 16,

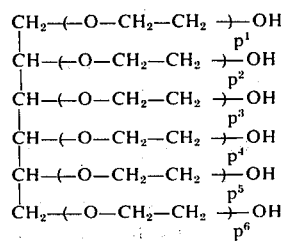

where the average number of $p^1$ to $p^6$ does not exceed 10, and

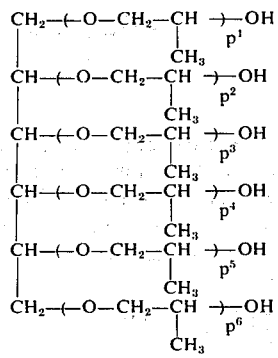

where the average number of $p^1$ to $p^6$ does not exceed 8. and polyalkyleneoxy triols or hexaols which are prepared by co-polyaddition of ethylene oxide and propylene oxide to glycerol, trimethylol ethane, tri-methylol propane, sorbitol and the like and having a number average molecular weight not exceeding 3000.

In the preparation of the photopolymerizable vinylurethane monomers of the first chemical formula and having no polyol component as the chain extender (group X), one mole of xylylene diisocyanate is made to react with about two moles of the ethylenically unsaturated alcohol. When the polyhydric alcohol is to be used for extention of the molecular weight if necessary the degree of the unsaturation of the photopolymerizable vinylurethane monomers of the present invention, an intermediate monoisocyanate compound is prepared previously by the addition reaction of xylylene diisocyanate to the ethylenically unsaturated alcohol in a molar ratio of one mole of the former and 1 to 1.2 mole of the latter because the presence of free xylylene diisocyanate should be avoided in the intermediate to be reacted with the polyhydric alcohol having 3 or more of hydroxyl groups in the molecule in order to prevent gelling. The intermediate is then made to react with the polyhydric alcohol in a reaction ratio of about one equivalent or less of the residual free isocyanate group in the intermediate per one equivalent of hydroxyl group in the polyhydric alcohol. It is not necessary to combine the molecule of the intermediate to the whole hydroxyl groups in the polyhydric alcohol, namely, the vinylurethane monomers may contain some free hydroxyl groups in their molecule. Therefore, when the polyhydric alcohol having 3 to 6 hydroxyl groups is used as the chain extender, the reaction ratio of the intermediate may be 1 to 0.7 equivalent of free isocyanate group therein per one equivalent of hydroxyl group in the polyhydric alcohol.

In the preparation of the vinylurethane monomers having dihydric alcohol component as the chain extender an alternative method may be adopted that one mole of the dihydric alcohol is made to react initially with two moles of xylylene diisocyanate to obtain an intermediate having two equivalents of isocyanate groups per one mole, and then the intermediate is made to react with two moles of the ethylenically unsaturated alcohol.

In the preparation of the vinylurethane monomers of the present invention, xylylene diisocyanate is made to react initially with the ethylenically unsaturated alcohol to form an intermediate adduct and then the adduct is made to react with the polyhydric alcohol. When no polyhydric alcohol is used as the chain extender simply the above initial reaction step will do, and when a dihydric is used as the chain extender an alternative method may be adopted that the three component compounds are made to react with each others together simultaneously in one reaction step. The reaction condition is rather moderate because of the high reactivity of the isocyanate groups with the hydroxyl groups. That is, for example, the ethylenically unsaturated alcohol or the polyhydric alcohol is added to xylylene diisocyanate or to the intermediate adduct with stirring and external cooling and, if necessary, reducing the viscosity of the reaction medium with the aid of favorable ethylenically unsaturated liquid monomers which are inert against the isocyanate groups and the hydroxyl groups as diluents. These monomers should have a boiling temperature higher than the reaction temperature and are selected from aromatic vinyl compounds such as styrene, acrylic monomers such as ethyl acrylate, methacrylic monomers such as methyl methacrylate, vinyl esters such as vinyl propionate, diallyl esters such as diallyl phthalate and the like. These monomers serve as the efficient components in the photocopolymerizable composition containing the vinylurethane monomers. The suitable range of the reaction temperature is from room temperature to about 100°C when the ethylenically unsaturated alcohol is present in the reaction medium and upto 160°C when the ethylenically unsaturated alcohol is absent in the reaction medium, and the time required to complete the reaction is usually not more than 10 hours for each reaction step.

If the suppression of the polymerization of the ethylenically unsaturated groups is needed strictly during the period of the reaction to avoid the gelling or the unfavorable increase of the viscosity, polymerization inhibitors are added to the reaction medium in an amount rather excessive than that usually employed, for the storage of the conventional ethylenically unsaturated monomers, say, up to 1000 parts per million by weight. As the suitable polymerization inhibitors there are, for example, benzoquinone, 2,6-ditert-butyl-4-methyl phenol, 2,2'-dimethyl-5,5'-ditert-butyl-4,4'-dihydroxy diphenyl thioether and chloranil.

The photopolymerizable vinylurethane monomers of the present invention thus prepared have various states and appearances, for example, the monomer composed of one mole of xylylene diisocyanate and two moles of 2-hydroxyethyl methacrylate is a crystalline, powdery substance in dry state after purification. On the other hand those prepared from two moles of xylylene diisocyanate, two moles of 2-hydroxyethyl acrylate and one mole of polyethylene glycol or polyproplyene glycol as the chain extender are viscous liquid or pasty mass according to the molecular weight of the glycols.

In the irradiation of the actinic rays to the photopolymerizable vinylurethane monomers they should be an even and plane layer in shape, particularly for the purpose of preparing a printing plate the surface of the layer must be perfectly smooth, therefore, when the vinylurethane monomers are solid or highly viscous liquid, they should be altered to a fluid composition having comparatively low viscosity by dissolving them in one or more of photocopolymerizable, ethylenically unsaturated liquid monomers. As the ethylenically unsaturated liquid monomers serviceable as the photocopolymerizing components in the composition there are, for example, aromatic vinyl compounds such as styrene, vinyl toluene and divinyl benzene, acrylic acid or its esters such as methyl acrylate, ethyl acrylate, isopropyl acrylate, n-butyl acrylate, isobutyl acrylate, 2-ethylhexyl acrylate, 2-hydroxyethyl acrylate, hydroxypropyl acrylates, ethyleneglycol diacrylate, di-, tri-, tetra- or polyethyleneglycol diacrylate, propyleneglycol diacrylate, di-, tri-, tetra- or polypropyleneglycol diacrylate, and glycidyl acrylate, methacrylic acid or its esters such as methyl methacrylate, ethyl methacrylate, isopropyl methacrylate n-butyl methacrylate, isobutyl methacrylate, lauryl methacrylate, 2-hydroxyethyl methacrylate, hydroxypropyl methacrylates, ethyleneglycol dimethacrylate, di-, tri-, tetra- or polyethyleneglycol dimethacrylate, propyleneglycol dimethacrylate, di-, tri-, tetra- or polypropyleneglycol dimethacrylate, N,N-diethylaminoethyl methacrylate, and glycidyl methacrylate, vinyl esters including vinyl acetate and vinyl propionate and diallyl esters such as diallyl phthalate, diallyl isophthalate, diallyl sebacate, diallyl fumarate and diallyl maleate.

The content of the vinylurethane monomers in the fluid composition should be at least 30 percent by weight. If the content is below 30 percent by weight the photocopolymerizability of the composition is reduced so that the practicality of the composition in the preparation of printing plates is lost.

In the ethylenically unsaturated monomers listed above, those except what are reactive with isocyanate compounds such as 2-hydroxyethyl methacrylate and the like may be added as thinning monomers in performing the reaction steps.

It is necessary to secure the photocurability of the composition by adding any suitable photosensitizer to the vinylurethane monomers. As the effective photosensitizers there are, for example, α-carbonyl alcohols including benzoin, butyroin, tolyoin and acetoin, acyloin ethers including benzoin methyl ether, benzoin ethyl ether, benzoin isopropyl ether, pivaloin ethyl ether and anisoin ethyl ether, vicinal polyketaldonyl compounds including diacetyl, dibenzoyl, dipheryltriketone, pentanedione-2,3 and phenylglyoxal,

α-hydrocarbon-substituted acyloins including α-methylbenzoin and α-phenyloenzoin, organic disulfides including di-n-butyl disulfide, dibenzyl disulfide, diphenyl disulfide, dibenzoyl disulfide, diacetyl disulfide and dibornyl disulfide, benzophenone, ω-halogenocarbonyl compounds including bromoacetophenone, aromatic sulfonyl halide including 1-naphthalene sulfonyl chloride and 2-naphthalene sulfonyl chloride, mercaptans including 2-mercaptobenzothiazole, thiols including p-methoxybenzene thiol, metal mercaptides including mercuric phenyl mercaptide, dithiocarbamates including carboxymethyl-N,N-dimethyldithiocarbamate, alkyl xanthene esters including 2-oxopropylene bis(-methyl xanthene)

thiuram derivatives including tetramethylthiuram disulfide, organic sulfenates including ethyl-2-benzothiazylsulfenate, and organic dyes including eosin, erythrosine and fluorescein. The suitable range of the amount of such photosensitizers to be added to the vinylurethane monomers or their compositions is from 0.1 to 5.0, preferably from 0.5 to 3.0 percent by weight. When the amount is below 0.1 percent by weight, the photosensitizing effect is not definite so that the practicality of the compositions for printing plates cannot be obtained and when the amount exceeds 5.0 percent by weight, an uneven curing of the irradiated layer is brought about causing the inferior resolving power of the printing plates due to the over-cure at the surface portion or causing the phenomenon of "under cut" (scooping out) of the relief in washing-out due to the insufficient cure at the bottom portion.

For the photopolymerization of the compositions containing the vinylurethane monomers it is necessary to irradiate with actinic rays having wave length of 2000 to 5000 Angstrom units preferably 2500 to 4000 Angstrom units depending on the species of the photosensitizers used. As the source of such actinic rays, for example, sun light, low and high pressure mercury lamp, carbon arc, xenon lamp and tungsten filament lamp can be adopted. The time of irradiation required for complete curing is usually from 10 seconds to 10 minutes for the layer of the compositions having the thickness of up to 5 millimeters.

The outstanding feature of the present invention is present in that the compositions containing the vinylurethane monomers derived from the xylylene diisocyanate have an extremely high photocurability. For example, they can cure at 3 to 5 times higher rate the photopolymerizable compositions containing the vinylurethane monomers derived from tolylene diisocyanate, 4,4'-diphenylmethane diisocyanate, hexamethylene diicocyanate and the like as the diisocyanate component.

The cured layer obtained with the composition of the present invention would show very favorable mechanical properties for use for the preparation of printing plates in letter press form. Namely, the cured layer is hard, tough and abrasion resistant in a distinguished degree as compared to those derived from the other photocurable polymeric compositions having no urethane structure such as what are containing unsaturated polyesters, polyacrylic ester or cellulosic derivatives made curable with any ethylenically unsaturated compound other than the vinylurethane monomers.

EXAMPLE 1

188 g (1 mole) of xylylene diisocyanate (Trade Name "Takenate 500" manufactured by Takeda Chemical Industries Ltd., Japan, isomeric constitution m-isomer/p-isomer = 65~75/35~25, same in every Examples which follow.) was added to 260 g (2 moles) of 2-hydroxyethyl methacrylate containing 90 mg (about 200 ppm) of 2,6-di-tert-butyl-4-methyl phenol in a reaction flask. The temperatures of the reaction mixture was held at 80°C for 6 hours under air atmosphere. Then the reaction mixture was cooled to room temperature to obtain the reaction product as a white and sticky solid. The isocyanate value of the product was below 5.

The characteristic "isocyanate value" used hereinafter is defined as the value of the weight of the —N=λ C=O group contained in one gram of the sample expressed in milligrams.

75 g of the reaction product was mixed well with 25 g of 2-hydroxyethyl methacrylate and to the mixture was added 1 g of benzoin ethyl ether to obtain a photocurable liquid composition.

The composition was applied to a primed steel plate to form a layer of 0.6 mm in thickness. The layer was then irradiated with light using a low pressure mercury lamp (manufactured by Tokyo Shibaura Electric Co., Ltd., Japan type FL-20 BL, power 20 W) 10 cm apart for 3 minutes. The irradiated layer was hard, tough and adherent to the steel substrate.

COMPARATIVE EXAMPLE 1

A photopolymerizable vinylurethane monomer was prepared in a like process as in Example 1 using 174 g (1 mole) of tolylene diisocyanate (a commercial product isomeric constitution : 2.4-isomer/2.6-isomer = 80/20, same in every Comparative Examples followed where tolylene disocyanate is used as the diisocyanate component) instead of 188 g of xylylene diisocyanate.

75 g of the reaction product was mixed well with 25 g of 2-hydroxyethyl methacrylate and to the mixture was added 1 g of benzoin ethyl ether to obtain a photocurable liquid composition.

The composition was applied to a primed steel plate and irradiated with light like in Example 1 for 3 minutes but did not harden. About 11 minutes' irradiation was required for perfect curing of the composition.

EXAMPLE 2

188 g (1 mole) of xylylene diisocyanate was added to 540 g (about 2 moles) of polyethyleneglycol monomethacrylate (the number average molecular weight of the polyethyleneglycol portion was about 200, trade name "Nissan Blenmer PE-200" manufactured by Nippon Oil & Fat Co., Ltd., Japan) containing 108 mg (about 200 ppm) of 2,6-di-tert-butyl-4-methyl phenol to react to each other.

The resultant divinylurethane monomer was a highly viscous liquid and was easily cured to form a hard mass which was insoluble in any organic solvent by irradiating with light in like operating condition as in Example 1.

EXAMPLE 3

76 g (1 mole) of propyleneglycol (1,2-propanediol) was added to 376 g (2 moles) of xylylene diisocyanate and the mixture was held at 120°C for 1 hour under nitrogen atmosphere. Then the reaction mixture was cooled to 80°C and to the mixture was then added 540 g (about 2 moles) of polyethyleneglycol monomethacrylate as used in Example 2 containing 108 mg (about 200 ppm) of 2,6-di-tert-butyl-4-methyl phenol and held at 80°C for 4 hours in air atmosphere to obtain a reaction product having an isocyanate value of 4 as a sticky paste. Thus obtained divinylurethane monomer could be easily cured by irradiation of actinic rays.

EXAMPLE 4 TO EXAMPLE 15

12 Divinylurethane monomers were prepared by using xylylene diisocyanate, alkyleneoxy glycols or alkylene glycols as the chain extender and hydroxylated alkylene or alkyleneoxy acrylates or hydroxylated alkylene or alkyleneoxy methacrylates as the ethylenically unsaturated alcohol.

The reaction processes except in Example 13 were like in Example 3. In Example 13, the three component materials were charged in a reaction flask simultaneously.

The whole operating conditions and the state of the reaction products are tabulated in Table 1.

EXAMPLE 16 TO EXAMPLE 21, COMPARATIVE EXAMPLE 2 TO COMPARATIVE EXAMPLE 7

100 g of some of the divinylurethane monomers prepared in foregoing Examples were dissolved in certain ethylenically unsaturated liquid monomers and to the solution was added photosensitizers to form photocurable compositions.

For comparison with the above divinylurethane monomer, some comparative divinylurethane monomers were prepared using tolylene diisocyanate (Compartive Examples 2, 3, 4 and 6), 4,4'-diphenylmethane diisocyanate (Comparative Example 5) or hexamethylene diisocyanate (Comparative Example 7) instead of xylylene diisocyanate in a similar reaction condition to the corresponding Example. These comparative divinylurethane monomers were also converted into photocurable compositions.

All the above compositions were applied onto a surface of a primed steel plate or a primed polyester sheet to form a layer 0.4 to 1.0 mm in thickness, and the layer was irradiated with actinic rays through a negative lithofilm. The partly hardened layer was then treated with an aqueous or non-aqueous developing liquid to wash out the uncured portion and finally given an after-exposure to harden the relief further.

Table 1

| Example No. | glycol kind[1] | amount[2] g(mol) | hydroxylated acrylate or methacrylate kind[3] | amount[4] g(mol) | polym. inhibitor contained(ppm)[5] | 1st stage temp.(°C), time(hrs) | 2nd stage temp.(°C), time(hrs) | reaction product (divinyl urethane monomer) |
|---|---|---|---|---|---|---|---|---|
| Ex.4 | PEG 400 | 400(1) | HEMA | 260(2) | WXR(300) | 120, 1.5 | 80, 3 | viscous liquid |
| Ex.5 | PEG 2000 | 2000(1) | HEA | 232(2) | PBQ(100) | 130, 2 | 70, 4 | white and sticky solid |
| Ex.6 | PPG 2000 | 2000(1) | HEMA | 260(2) | WXR(200) | 130, 2 | 70, 4 | highly viscous liquid |
| Ex.7 | 1,3-propanediol | 76(1) | HPMA | 288(2) | BHT(200) | 120, 1 | 80, 3 | pasty |
| Ex.8 | 1,2-butanediol | 90(1) | PE-200 | 540(2) | WXR(200) | 120, 1.5 | 80, 4 | viscous liquid |
| Ex.9 | 1,3-butanediol | 90(1) | PE-200 | 540(2) | WXR(200) | 120, 1.5 | 80, 4 | viscous liquid |
| Ex.10 | 1,4-butanediol | 90(1) | PE-200 | 540(2) | WXR(200) | 120, 1.5 | 80, 4 | viscous liquid |
| Ex.11 | 2,3-butanediol | 90(1) | PE-200 | 540(2) | WXR(200) | 120, 2 | 80, 4 | viscous liquid |
| Ex.12 | neopentyl glycol | 104(1) | HPA | 260(2) | PBQ(50) | 120, 1.5 | 70, 5 | sticky solid |
| Ex.13 | 1,5-heptanediol | 104(1) | HPA | 260(2) | PBQ(50) | 120, 2 | | pasty |
| Ex.14 | 1,6-hexanediol | 118(1) | HEMA | 260(2) | WXR(200) | 120, 1.5 | 80, 3.5 | highly viscous liquid |
| Ex.15 | 2-methyl pentane-2,4-diol | 118(1) | HEMA | 260(2) | WXR(200) | 120, 2 | 80, 4 | pasty |

Notes
[1] PEG 400 polyethyleneglycol having a number average molecular weight of 400.
   PEG 2000 polyethyleneglycol having a number average molecular weight of 2000.
   PPG 2000 polypropyleneglycol having a number average molecular weight of 2000.
[2] Amount versus 376 g (2 moles) of xylylene diisocyanate
[3] HEMA 2-hydroxyethyl methacrylate
   HEA 2-hydroxyethyl acrylate
   HPMA 2-hydroxypropyl methacrylate
   HPA 2-hydroxypropyl acrylate
   PE-200 polyethyleneglycol monomethacrylate
   (same as in Example 3)
[4] Amount versus 376 g (2 moles) of xylylene diisocyanate
[5] WXR 2,2'-dimethyl-5,5'-di-tert-butyl-4,4'-dihydroxydiphenyl thioether
   BHT 2,6-di-tert-butyl-4-methyl phenol
   PBQ p-benzoquinone The experimental conditions and test results are tabulated in the following Table 2.

stead of glycerol. The trimethylol ethane was used as a solution in 302 g of methyl methacrylate containing Table 2

| Example No. | divinylurethane monomer prepared in or in comparison with | thinning[1] monomers (g) | photosensitizer (% by wt.) | thickness[2] of the layer (mm) | source[3] of rays | irradiating[4] time (min.) | developing[5] liquid | time for[6] after-exposure (min.) | applicability |
|---|---|---|---|---|---|---|---|---|---|
| 16 | Ex.4 | HEMA(33) | benzoin ethyl ether(1) | 0.8 | C | 2.5 | D | 1 | printing plate for letter press |
| p.Ex.2 | Ex.4 | HEMA(33) | benzoin ethyl ether(1) | 0.8 | C | 10 | D | 3 | — |
| 17 | Ex.5 | MA(75) 4G(75) | diacetyl (0.5) | 1.0 | C | 6 | water | 3 | printing plate for flexography |
| p.Ex.3 | Ex.5 | MA(75) 4G(75) | diacetyl (0.5) | 1.0 | C | 20 | water | 10 | — |
| 18 | Ex.6 | MMA(43) | benzoin methyl ether(1) | 1.0 | B | 5 | E | 3 | printing plate for flexography |
| p.Ex.4 | Ex.6 | MMA(43) | benzoin methyl ether(1) | 1.0 | B | 15 | E | 5 | — |
| 19 | Ex.10 | HEMA(25) | benzoin(1) | 0.6 | A | 7 | D | 1.5 | printing plate for letter press |
| p.Ex.5 | Ex.10 | HEMA(25) | benzoin(1) | 0.6 | A | 20 | D | 4 | — |
| 20 | Ex.12 | EA(33) | benzophenone (1.5) | 0.6 | A | 5 | F | 3 | printing plate for letter press |
| p.Ex.6 | Ex.12 | EA(33) | benzophenone (1.5) | 0.6 | A | 18 | F | 6 | — |
| 21 | Ex.14 | HEMA 25 | benzoin methyl ether(1) | 0.4 | C | 4 | F | 2 | printing plate for dry off-set |
| p.Ex.7 | Ex.14 | HEMA 25 | benzoin methyl ether(1) | 0.4 | C | 15 | F | 5 | — |

Notes
[1]MA methyl acrylate
  MMA methyl methacrylate
  EA ethyl acrylate
  HEMA 2-hydroxyethyl methacrylate
  4G tetraethyleneglycol dimethacrylate
[2]In Ex. 17, Ex. 18, Comp. Ex. 3 and Comp. Ex. 4 a primed polyester sheet was used as the substrate, and in the other Examples a primed steel plate was used.
[3]A carbon arc, output 1 KW, 50 cm apart from the layer
  B high pressure mercury lamp, output 0.4 KW, 20 cm apart from the layer
  C low pressure mercury lamp, Type FL-20 BL (made by Tokyo Shibaura Electric Co., Ltd., Japan), output 20 W, 10 cm apart from the layer
[4]Time required for the hardening of the exposed portion
[5]D 5% (weight) aqueous solution of sodium dodecyl benzene sulfonate
  E a water/ethyl alcohol mixture (volume ratio 6/4)
  F 1,1,2-trichloroethylene
[6]The same light source as in the main exposure was used.

EXAMPLE 22

To 468 g (3.6 moles) of 2-hydroxyethyl methacrylate containing 100 mg of p-benzoquinone in a reaction flask 620 g (3.3 moles) of xylylene diisocyanate was charged in small increments in air atmosphere and the reaction system was kept throughout at 60°C for 8 hours under gentle stirring.

Thus a methacrylate-isocyanate adduct was obtained as a white pasty mass.

As the second reaction step the adduct was added to 280 g of methyl methacrylate containing 14 mg of p-benzoquinone to dissolve and heated to 90°C, and 92 g (1 mole) of glycerol was dropped into the solution. After keeping the reaction system at the same temperature for 5 hours, the isocyanate value of the solid component in the solution was dropped down to about 6 and a viscous solution containing the trivinylurethane monomer was obtained. 0.5 % by weight of diacetyl was then added to the solution as a photosensitizer to obtain a photocurable composition which could be cured easily by irradiation of actinic rays.

EXAMPLE 23

A reaction process similar to Example 22 was repeated using 120 g (1 mole) of trimethylol ethane instead of glycerol. The trimethylol ethane was used as a solution in 302 g of methyl methacrylate containing 100 mg of 2,6-di-tert-butyl-4-methyl phenol.

The photocurability of the composition thus obtained was similar to that of the composition prepared in Example 22.

EXAMPLE 24

A reaction process similar to Example 22 was again repeated using 134 g (1 mole) of trimethylol propane instead of glycerol. The trimethylol propane was used as a solution in a mixture of 214 g of ethyl acrylate and 92 g of styrene containing 92 mg of 2,6-di-tert-butyl-4-methyl phenol.

The photocurability of the composition thus obtained was similar to that of the composition prepared in Examle 22.

EXAMPLE 25 TO EXAMPLE 32, COMPARATIVE EXAMPLE 8 TO COMPARATIVE EXAMPLE 11

Photopolymerizable compositions of vinylurethane monomer were prepared in like process as in Example 22 using 3 to 6 valent polyhydric alcohols as the chain extender. 2-Hydroxypropyl acrylate, 2-hydroxypropyl methacrylate and polyethyleneglycol monomethacrylate were used as the ethylenically unsaturated alcohol. Thinning monomers other than 2-hydroxyethyl methacrylate were added to the reaction system in the second stage of the reaction process.

To the solutions of the vinylurethane monomer were then added a photosensitizer to form photocurable compositions and applied onto a surface of a primed steel plate to form a layer 0.8 mm in thickness. The layer was irradiated with actinic rays through a negative lithofilm, treated with an aqueous or non-aqueous liquid to wash out the unexposed portion and finally given an after-exposure to harden the relief further.

Comparing with some Examples several experiments were done as the Comparative Examples using tolylene diisocyanate instead of xylylene diisocyanate.

The whole experimental conditions and test results are tabulated in following Table 3.

Table 3

| Example No. | amount of XDI or IDI g(mol) | ethylenically unsat alcohols kind[1] | amount g(mol) | polym.in-hibitor(ppm) | polyhydric alcohols kind[2] | amount g(mol) | thinning[3] monomers king. (g) | reaction scheme tem.(°C), time (hrs.) 1st stage | 2nd stage |
|---|---|---|---|---|---|---|---|---|---|
| Ex.25 | 827(4.4) | PE-200 | 1296(4.8) | BHT(500) | PE | 136(1) | MMA (484) HEMA(484) | 80, 4 | 80, 4 |
| Com.Ex.8 | 766(4.4) | PE-200 | 1296(4.8) | BHT(500) | PE | 136(1) | MMA(471) HEMA(471) | 80, 2 | 80, 4 |
| Ex.26 | 1033(5.5) | HPA | 780(6.0) | BHT(500) | xylytol | 152(1) | EA (1310) | 60, 8, | 80, 5 |
| Ex.27 | 1240(6.6) | HPMA | 1037(7.2) | WXR(500) | DPE | 254(1) | BMA(1265) HEMA(422) | 60, 8, | 80, 4 |
| Ex.28 | 1240(6.6) | HPMA | 1037(7.2) | WXR(500) | sorbitol | 182(1) | BMA(1229) HEMA(410) | 60, 8, | 80, 5 |
| Ex.29 | 620(3.3) | HPMA | 519(3.6) | BHT(300) | G-P 600 | 600(1) | EA (580) HEMA(580) | 60, 8, | 80, 6 |
| Comp.Ex.9 | 574(3.3) | HPMA | 519(3.6) | BHT(300) | G-P 600 | 600(1) | EA (565) HEMA(565) | 80, 3, | 80, 6 |
| Ex.30 | 620(3.3) | HPMA | 519(3.6) | WXR(300) | 15-100 | 1100(1) | EMA(560) | 60, 8, | 80, 6 |
| Ex.31 | 620(3.3) | HPMA | 519(3.6) | BHT(200) | T-P 400 | 400(1) | MMA (385) | 60, 8, | 80, 6 |
| Comp.Ex.10 | 574(3.3) | HPMA | 519(3.6) | BHT(200) | T-P 400 | 400(1) | MMA (373) | 80, 3, | 80, 6 |
| Ex.32 | 1240(6.6) | HPA | 936(7.2) | PBQ(50) | S-P 750 | 700(1) | St (1438) MMA (1438) | 60, 8, | 80, 6 |
| Comp.Ex.11 | 1148(6.6) | HPA | 936(72) | PBQ(50) | S-P 750 | 700(1) | St (1392) MMA (1392) | 80, 3, | 80, 6 |

| Example No. | photosensitizer (% by wt.) | source[4] of rays | irrdia[5] ting time (min.) | treating liq.[6] for wash out | time for[7] after-exposure(min.) | applicability |
|---|---|---|---|---|---|---|
| Ex.25 | diacetyl (0.5) | C | 2 | F | 1.5 | printing plate for letter press original plate for duplicate platemaking |
| Comp.Ex.8 | diacetyl (0.5) | C | 7 | F | 3 | — |
| Ex.26 | benzoin me. ether (1) | A | 1 | F | 1 | same as Ex.25 |
| Ex.27 | benzoin i-pn ether (1) | A | 0.5 | F | 1 | same as Ex.25 |
| Ex.28 | bromoacetophenone(2) | B | 0.67 | F | 1 | same as Ex.25 |
| Ex.29 | benzoin(1) | C | 1.5 | E | 1.5 | Same as Ex.25 |
| Comp.Ex.9 | benzoin(1) | C | 8 | E | 3 | — |
| Ex.30 | 2-napthalene sulfochloride (0.5) | B | 1 | D | 1 | Same as Ex.25 |
| Ex.31 | benzoin ethyl ether(1) | C | 0.5 | E | 1 | Same as Ex.25 |
| Comp.Ex.10 | benzoin ethyl ether(1) | C | 2 | E | 2 | — |
| Ex.32 | benzophenone (2) | C | 0.33 | E | 1 | Same as Ex.25 |
| Comp.Ex.11 | benzophenone (2) | C | 2 | E | 2 | — |

Notes
[1] Abbr. are the same as Note 3) in Table 1.
[2] PE    Pentaerithritol
    DPE    dipentaerithritol
    G-P 600    Trade Name "New-Pol G-P 600", manufactured by Sanyo Chemical Industry Co., Ltd., Japan
    Chemical formula

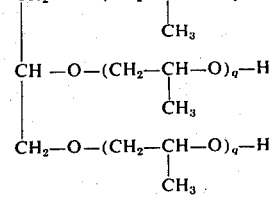

a number average molecular weight of 600

15-100    Trade Name "Polyglycol 15-100", manufactured by The Dow Chemical Co., U.S.A.
    chemical formula

Table 3-continued

| Example No. | amount of XDI or IDI g(mol) | ethylenically unsat alcohols ||| polyhydric alcohols || thinning[3] monomers king. (g) | reaction scheme tem.(°C), time (hrs.) ||
|---|---|---|---|---|---|---|---|---|---|
| | | kind[1] | amount g(mol) | polym.inhibitor(ppm) | kind[2] | amount g(mol) | | 1st stage | 2nd stage |
| T-P 400 | | a number average molecular weight of 1100 Trade Name "New-Pol T-P 400", manufactured by Sanyo Chemical Industry Co., Ltd., Japan chemical formula | | | | | | | |

$$\begin{array}{c} CH_2-O-(CH_2-CH-O)_q-H \\ | \\ CH_3 \end{array}$$

$$CH_3-CH_2-C-CH_2-O-(CH_2-CH-O)_q-H$$
$$|$$
$$CH_3$$

$$CH_2-O-(CH_2-CH-O)_q-H$$
$$|$$
$$CH_3$$

| S-P 750 | | a number average molecular weight of 400 Trade Name "New-Pol S-P 750", manufactured by Sanyo Chemical Industry Co., Ltd., Japan chemical formula | | | | | | | |

$$CH_2-O-(CH_2-CH-O)_q-H$$
$$|$$
$$CH_3$$

$$CH-O-(CH_2-CH-O)_q-H$$
$$|$$
$$CH_3$$

$$CH-O-(CH_2-CH-O)_q-H$$
$$|$$
$$CH_3$$

$$CH-O-(CH_2-CH-O)_q-H$$
$$|$$
$$CH_3$$

$$CH-O-(CH_2-CH-O)_q-H$$
$$|$$
$$CH_3$$

$$CH_2-O-(CH_2-CH-O)_q-H$$
$$|$$
$$CH_3$$

a number average molecular weight of 700

[3]
- MMA — methyl methacrylate
- EA — ethyl acrylate
- EMA — ethyl methacrylate
- BMA — n-butyl methacrylate
- St — styrene
- HEMA — 2-hydroxyethyl methacrylate 4), 5), 6) & 7) Same as the Notes 3), 4), 5) & 6) in Table 2 respectively.

What is claimed is:

1. A fluid composition comprising a photopolymerizable vinylurethane monomer, a photocopolymerizable ethylenically unsaturated liquid monomer and a photosensitizer, said vinylurethane monomer having a chemical formula

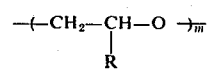

wherein
R represents a hydrogen atom or a methyl group and
A represents an alkyleneoxy group or a polyalkyleneoxy group of the formula $$-(-CH_2-CH-O-)_{\overline{m}}$$
$$|$$
$$R$$

wherein
R is a hydrogen atom or a methyl group and
$m$ is a positive integer of 1 to 11.

2. A fluid composition comprising a photopolymerizable vinylurethane monomer, a photocopolymerizable ethylenically unsaturated liquid monomer and a photosensitizer, said vinylurethane monomer having a chemical formula:

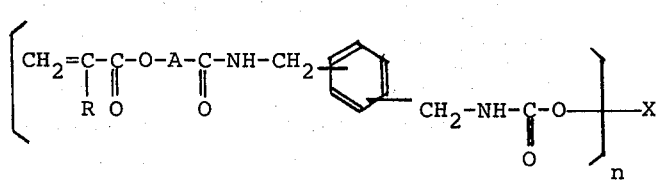

wherein
R represents a hydrogen atom or a methyl group,
A represents an alkyleneoxy group or a polyalkyleneoxy group of the formula

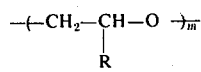

wherein
R is a hydrogen atom or a methyl group and
m is a positive integer of 1 to 11,
X represents an alkylene group, a polyalkyleneoxy group, an alkane-tri-, -tetra-, -penta- or -hexa-yl group or an oxygenated alkane-tri-, -tetra-, -penta- or -hexa-yl group, and
n represents a corresponding number to the valency of said group X selected from 2 to 6.

3. The fluid composition according to claim 2 wherein in said vinylurethane monomer $n$ represents 6, and
said X represents an oxygenated alkane-hexa-yl group expressed by the chemical formula such that being formed by co-polyaddition of ethylenoxy and propyleneoxy structures with an alkane-hexa-yl group expressed by the formula

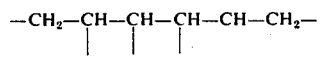

and having a number average molecular weight not exceeding 3000.

4. The fluid composition according to claim 1, wherein said photocopolymerizable ethylenically unsaturated liquid monomer is at least one member selected from a consisting cosistig essentially of aromatic vinyl compounds, acrylic acid and esters thereof, methacrylic acid and esters thereof, vinyl esters and diallyl esters.

5. The fluid composition according to claim 2, wherein said photocopolymerizable ethylenically unsaturated liquid monomer is at least one member selected from a group consisting essentially of aromatic vinyl compounds, acrylic acid and esters thereof, methacrylic acid and esters thereof, vinyl esters and diallyl esters.

6. The fluid composition according to claim 1, wherein said photosensitizer is at least one member selected from a group consisting essentially of α-carbonyl alcohols; acyloin ethers, vicinal polyketaldonyl compounds, α-hydrocarbo-substituted acyloins, organic disulfides, benzophenone, ω-halogenocarbonyl compounds, aromatic sulfonyl halides, mercaptans, metal mercaptides, dithiocarbamates, alkyl xanthene esters, thiuram derivatives, organic sulfonates and organic dyes.

7. The fluid composition according to claim 2, wherein said photosensitizer is at least one member selected from a group consisting essentially of
α-carbonyl alcohols including benzoin, butyroin, tolyoin and acetoin;
acyloin ethers including benzoin methyl ether, benzoin ethyl ether, benzoin isopropyl ether, pivaloin ethyl ether and anisoin ethyl ether;
vicinal polyketaldonyl compounds including diacetyl, dibenzoyl, dipheyl-triketone, pentanedione-2,3 and phenylglyoxal; α-hydrocarbo-substituted acyloins including α-methylbenzoin and α-phenylbenzoin;
organic disulfides including di-n-butyl disulfide, dibenzyl disulfide, diphenyl disulfide, dibenzoyl disulfide, diacetyl disulfide and dibornyl disulfide;
benzophenone;
ω-halogenocarbonyl compounds including bromoacetophenone, aromatic sulfonyl halide including 1-naphthalene sulfonyl chloride and 2-naphthalene sulfonyl choride;
mercaptans including 2-mercaptobenzothiazole;
thiols including p-methoxybenzene thiol;
metal mercaptides including mercuric phenyl mercaptide;
dithiocarbamates including carboxymethyl-N,N-dimethyldithiocarbamate;
alkyl xanthene esters including 2-oxopropylene bis(-methyl xanthene);
thiuram derivatives including tetramethylthiuram disulfide;
organic sulfenates including ethyl-2-benzothiazyl-sulfenate; and
organic dyes including eosin, erythrosine and fluorescein.

8. The fluid composition according to claim 2, wherein in said vinylurethane monomer $n$ is 3, and X represents an oxygenated alkane-tri-yl group formed by the reaction of a 3 to 6 valent polyhydric alcohol with an ethylenically unsaturated alcohol.

* * * * *

UNITED STATES PATENT AND TRADEMARK OFFICE
CERTIFICATE OF CORRECTION

PATENT NO. : 3,954,584
DATED : May 4, 1976
INVENTOR(S) : Nobuyoshi Miyata et al

It is certified that error appears in the above-identified patent and that said Letters Patent are hereby corrected as shown below:

Column 9, line 26, after "dric", insert --alcohol--;

Column 10, line 53, after "unsaturated" insert --liquid--;

Column 12, line 12, change "temperatures" to --temperature--;

Column 12, line 20, change "—N=$\lambda$ C=O" to -- — N=C=O--;

Column 15, line 68, after "in-", insert --stead of glycerol. The trimethylolethane was used as a solution of 302g of methyl methacrylate containing--;

Columns 15 and 16, Table 2, change "p. Ex. 2 .... p. Ex. 7" to --Comp. Ex. 2 .... Comp. Ex. 7--;

Column 19, in the notes, change "8MA" to --BMA--;

Claim 4, line 4, before "consisting" insert --group--;

Claim 4, line 4, after "consisting delete "cosistig";

UNITED STATES PATENT AND TRADEMARK OFFICE
CERTIFICATE OF CORRECTION

PATENT NO. : 3,954,584
DATED : May 4, 1976
INVENTOR(S) : Nobuyoshi Miyata et al

It is certified that error appears in the above-identified patent and that said Letters Patent are hereby corrected as shown below:

Claim 7, after line 3, cancel lines 4 - 35 and insert -- $\alpha$ carbonyl alcohols; acyloin ethers, vicinal polyetaldonyl compounds, $\alpha$-hydrocarbo-substituted acyloins, organic disulfides, benzophenone, $\omega$-halogenocarbonyl compounds, aromatic sulfonyl halides, mercaptans, metal mercaptides, dithiocarbamates, alkyl zanthene ester, thiuram derivatives, organic sulfonates and organic dyes. --;

Signed and Sealed this

Eighteenth Day of January 1977

[SEAL]

Attest:

RUTH C. MASON
Attesting Officer

C. MARSHALL DANN
Commissioner of Patents and Trademarks

UNITED STATES PATENT AND TRADEMARK OFFICE
CERTIFICATE OF CORRECTION

PATENT NO. : 3,954,584
DATED : May 4, 1976
INVENTOR(S) : Nobuyoshi Miyata et al

It is certified that error appears in the above-identified patent and that said Letters Patent are hereby corrected as shown below:

Claim 3, line 9, change "$-CH_2-CH-CH-CH-CH-CH_2-$"

to -- $-CH_2-CH-CH-CH-CH-CH_2-$ --.

Signed and Sealed this

Twenty-second Day of February 1977

[SEAL]

Attest:

RUTH C. MASON
*Attesting Officer*

C. MARSHALL DANN
*Commissioner of Patents and Trademarks*